United States Patent
Clevenger et al.

(10) Patent No.: US 7,001,835 B2
(45) Date of Patent: Feb. 21, 2006

(54) CRYSTALLOGRAPHIC MODIFICATION OF HARD MASK PROPERTIES

(75) Inventors: Lawrence A. Clevenger, LaGrangeville, NY (US); Andrew P. Cowley, Wappingers Falls, NY (US); Timothy J. Dalton, Ridgefield, CT (US); Mark Hoinkis, Fishkill, NY (US); Steffen K. Kaldor, Fishkill, NY (US); Kaushik A. Kumar, Beacon, NY (US); Stephen M. Rossnagel, Pleasantville, NY (US); Andrew H. Simon, Fishkill, NY (US); Douglas C. La Tulipe, Jr., Danbury, CT (US)

(73) Assignees: International Business Machines Corporation, Armonk, NY (US); Infineon Technologies, AG, Munich (DE)

( * ) Notice: Subject to any disclaimer, the term of this patent is extended or adjusted under 35 U.S.C. 154(b) by 42 days.

(21) Appl. No.: 10/707,119

(22) Filed: Nov. 21, 2003

(65) Prior Publication Data

US 2005/0112862 A1   May 26, 2005

(51) Int. Cl.
*H01L 21/4763* (2006.01)

(52) U.S. Cl. ..................... 438/618; 438/637
(58) Field of Classification Search ............... 438/618, 438/619, 622, 623, 626, 627, 628, 629, 637
See application file for complete search history.

(56) References Cited

U.S. PATENT DOCUMENTS

| | | | |
|---|---|---|---|
| 5,135,808 A * | 8/1992 | Kimock et al. | 428/336 |
| 5,741,626 A | 4/1998 | Jain et al. | |
| 6,287,910 B1 | 9/2001 | Lee et al. | |
| 6,316,328 B1 * | 11/2001 | Komuro | 438/401 |
| 6,358,766 B1 * | 3/2002 | Kasahara | 438/30 |
| 6,562,710 B1 * | 5/2003 | Nakagawa et al. | 438/619 |
| 6,723,614 B1 * | 4/2004 | Sugiyama | 438/401 |

* cited by examiner

*Primary Examiner*—Phuc T. Dang
(74) *Attorney, Agent, or Firm*—Ira D. Blecker

(57) ABSTRACT

A hardmask layer in the back end of an integrated circuit is formed from TaN having a composition of less than 50% Ta and a resistivity greater than 400 $\mu$Ohm-cm, so that it is substantially transparent in the visible and permits visual alignment of upper and lower alignment marks through the hardmask and intervening layer(s) of ILD. A preferred method of formation of the hardmask is by sputter deposition of Ta in an ambient containing $N_2$ and a flow rate such that ($N_2$ flow)/($N_2$+carrier flow)>0.5.

10 Claims, 3 Drawing Sheets

CRYSTALLOGRAPHIC MODIFICATION OF HARD MASK PROPERTIES

BACKGROUND OF INVENTION

TECHNICAL FIELD

The field of the invention is that of integrated circuit processing, in particular a mask layer for a reactive ion etching process that is optically transparent for lithographic alignment to the previous layer, by using a refractory metal and its nitride.

BACKGROUND OF THE INVENTION

Reactive ion etching, or dry etching, has been developed to a considerable degree of sophistication, in which, for example, the operator is able to adjust the parameters of operation to produce a highly directional etch that is able to etch deep trenches for capacitors that are 8 microns deep and less than 1 micron wide, as well as substantially isotropic etches that are able to etch transversely.

In modern practice, it is customary to use a thin layer of an etch-resistant material as a mask, referred to as a hardmask, during the etching process. The term hardmask comes from the fact that the materials used are harder than the rubbery photoresist that had been used for wet etches and for earlier versions of reactive ion etch.

Various substances such as silicon oxide (SiO2) and silicon nitride (SiNx) have been used as hardmasks, depending on the chemistry of the active gas in the etching step, and the etch resistance required in the patterning of a dielectric stack. However, as the dielectric stack keeps getting complicated, and the requirement on the critical dimension (CD) control becomes tight, the requirement on the etch resistance of the hardmask becomes an important factor. Refractory metals and their nitrides, such as Ta, TaNx, Ti, TiNx, W and WNx, afford an enhanced etch resistance behavior when compared to their dielectric counterparts, such as SiO2 and SiNx, during the patterning of complicated dielectric stacks.

Those skilled in the art are aware that the refractory metals have good thermal properties and are also useful in forming suicides that improve the conductivity of contacts between silicon and the metal interconnect structure.

Some refractory metals have good diffusion resistance to copper and have been used as liners in copper interconnect, where it is important to prevent the copper from diffusing through the interlevel dielectric.

U.S. Pat. No. 6,287,910 teaches the use of a $Ta_3N_5$ compound as a capacitor dielectric. This reference also teaches the use of TaN as a capacitor electrode.

U.S. Pat. No. 5,741,626 teaches the use of $Ta_3N_5$ as an anti-reflective coating that can be etched with fluorine ($CF_4$) chemistry to expose the underlying conductive material in a damascene interconnect structure.

One of the critical components in the fabrication of a multi-level interconnect structure is that the metal lines and vias be aligned to the corresponding metal lines at the lower levels in order to have a workable circuit. In order to achieve this, lithography alignment marks are typically fabricated in the Si substrate or at every metal level. This allows lithography to align subsequent levels with aid of these alignment marks.

As dimensions of feature sizes shrink in integrated circuit processing, the accuracy of alignment becomes critical, since an error that can be tolerated in the Nth generation of processing technology will likely cause a fatal defect in the (N+1)th generation of processing technology. In an alignment process, sets of upper and lower alignment marks, separated by one or more layers of interlevel dielectric (ILD) are formed in an arrangement such as that shown in FIG. 3. If the ILD or the hardmask is not transparent, the two sets of marks cannot be seen at the same time. Methods have been developed to deal with this situation, but at the cost of reduced alignment accuracy.

Previous transparent materials, such as $SiO_2$ and SiNx, have drawbacks, such as higher dielectric constant and lower etch resistance to some etchants, when used in current processing.

The art would benefit from having available a hardmask material that can be effective in thin layers and also be transparent, so that alignment marks on a lower level will show through the hardmask.

SUMMARY OF INVENTION

The invention relates to a method and structure of a hardmask for a reactive ion etch process that is composed of a compound of a refractory material, or more specifically a nitride, that is also optically transparent for lithographic alignment.

A feature of the invention is the use of a film of TaN as a mask in reactive ion etching.

A feature of the invention is the increase of the amount of N in the film.

Another feature of the invention is an increase in N flow, together with a decrease in magnetron power.

Another feature of the invention is an increase in the resistivity of the film.

DETAILED DESCRIPTION

Figure 1:
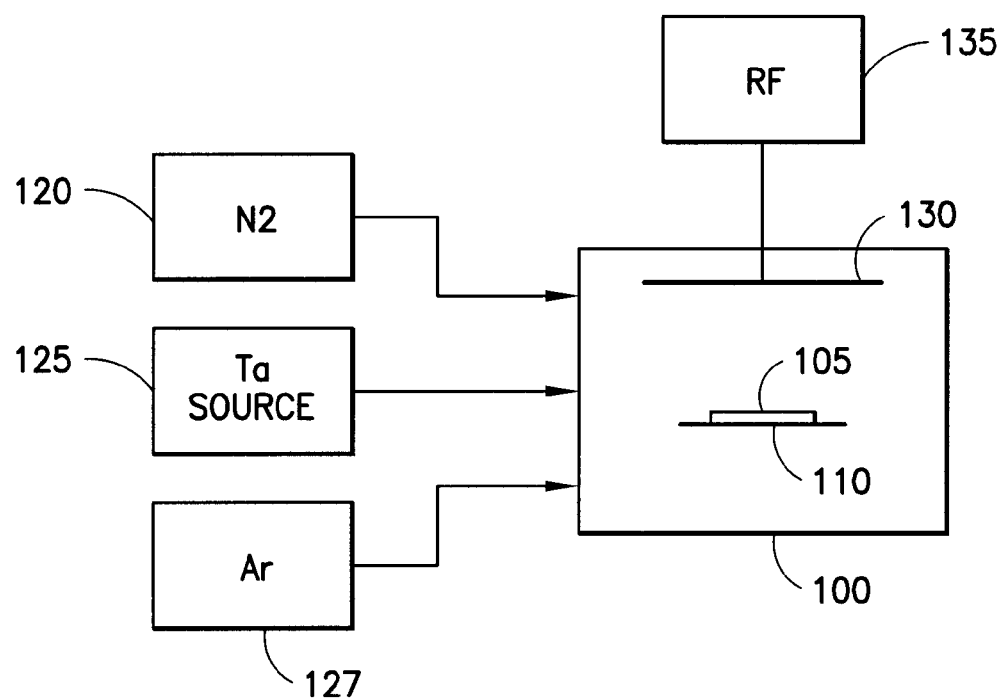
FIG. 1 illustrates in partially pictorial, partially schematic form an embodiment of the invention.

FIG. 1 shows in partially pictorial, partially schematic fashion a deposition apparatus that may be used to deposit a hardmask film according to the invention.

In the center of the Figure, vacuum chamber 100 contains a wafer, represented schematically by rectangle 105, that serves as a substrate for the deposition of the hardmask.

On the left of vacuum chamber 100, boxes 120 and 127 represent sources for input gases. $N_2$ is supplied by source 120 and Ar is supplied by source 127. In the embodiment illustrated, the source, represented schematically by Box 125, may be a supply of a precursor gas that reacts with the N source to form TaN.

At the top, RF supply 135 supplies power to an electrode 130 that is used to create a plasma, in order to dissociate the Ta precursor and the $N_2$ gas, and help in the deposition of the TaN film on the wafer represented by 105. Illustratively, the apparatus illustrated may be a Model Centura CVD tool from Applied Materials. In an alternative embodiment, the source of the primary material to be deposited forms the electrode 130 and is referred to those versed in the art as a target. Rotating magnets are placed behind the electrode (not shown in the figure) and the power is supplied by a DC power supply (not shown in the figure) in order to create a DC-magnetron plasma. This plasma reactively sputters the target with Ar and $N_2$, and deposits TaN film on the wafer represented by 105. Illustratively, the apparatus may be a Model Endura PVD tool from Applied Materials.

The ($N_2$ flow)/($N_2$+Ar flow) ratio in the prior art of depositing $Ta_3N_5$ for use as a liner was about 0.35. This produced films with resistivities of about 300 to 400 $\mu$Ohm-cm. Such low resistivities are preferable for use as a liner in an interconnect structure, but are not acceptable as a hardmask, as the films are not transparent for lithographic alignment to the lower levels.

The magnetron power used in the prior art to deposit liners in interconnect structures was typically about 6 $W/cm^2$. In the course of evaluating films according to the invention, the power was varied from 1 $W/cm^2$ to 10 $W/cm^2$.

As another variable parameter in the process, the N flow rates were varied, from an $N_2$:Ar ratio of 0.35 to an $N_2$:Ar ratio of 1.2.

With the range of parameters specified above, the resistivity of the resultant TaN films ranged from 1000 $\mu$Ohm-cm to 15000 $\mu$Ohm-cm. The film thickness ranges from 5 nm to 100 nm. It has been found that TaN films with resistivity in this range are sufficiently transparent to enable through-film optical alignment during the construction of multi-layer wiring.

As a practical application, the invention has been practiced in a process flow using a 90 nm ground rule.

It is an advantageous feature of the invention that the process window is rather wide. The range of acceptable resistivity can vary upward from a threshold of 1000 $\mu$Ohm-cm by a factor of fifteen.

A typical value of the film composition for a film according to the invention ranges from 40 to 45 at % for Ta and 55 to 60 at % for N. This is in contrast to a typical composition of the low resistivity film used for an interconnect liner of 51.1 at % Ta and 47.6 at % N. It has been found that films having a composition of less than a 2:1 ratio of N to Ta are acceptable.

The physical structure of the film at the lower end of the resistivity range is a mixture of hexagonal and cubic crystal phases. As the resistivity becomes greater, the mix changes to a greater concentration of hexagonal crystals.

It does not matter for the practice of the invention whether the upper alignment marks are placed at locations determined by looking through the ILD at the lower marks or whether the upper marks are placed conventionally and the pattern for the interconnect is located by looking at the lower marks through the ILD.

Figure 2:
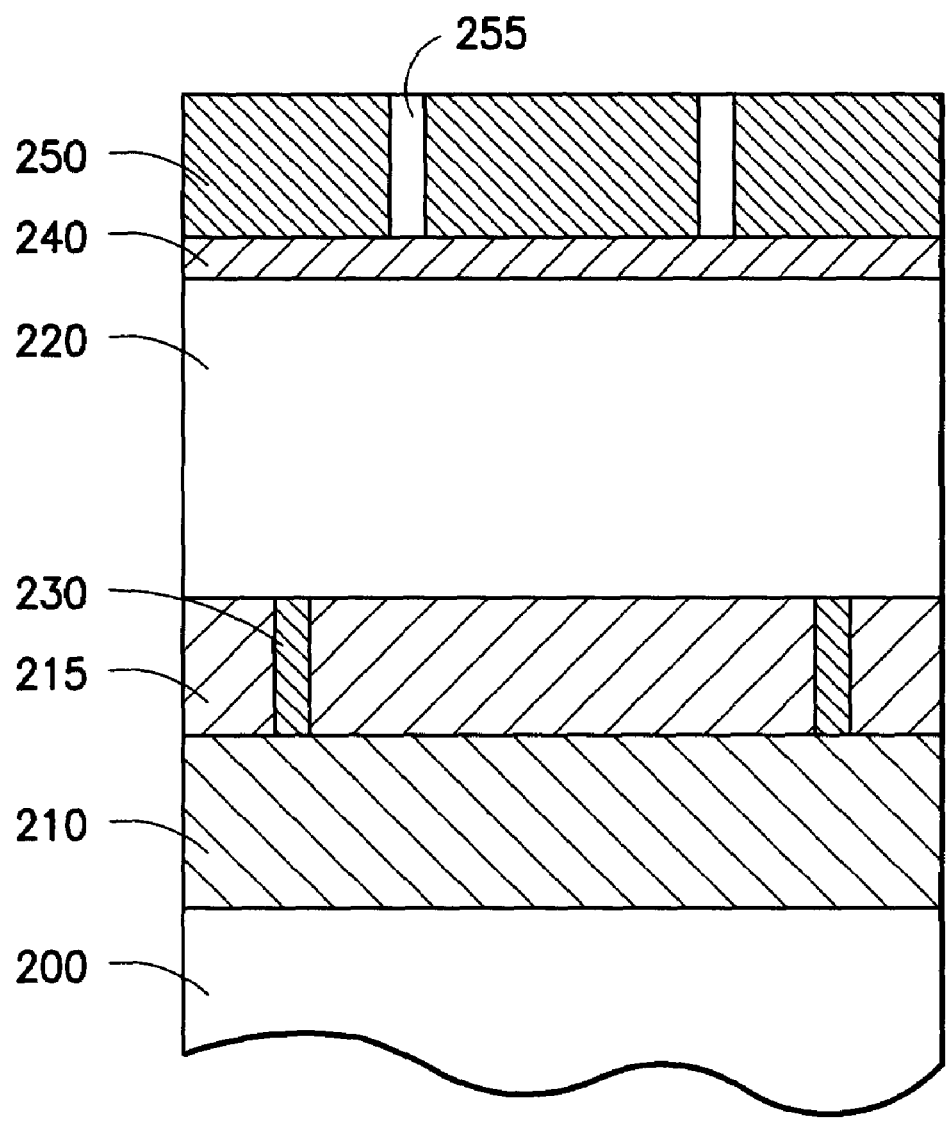
FIG. 2 is a cross section of a portion of the back end of a circuit employing the invention.

FIG. 2 shows in cross section a portion of the back end of an integrated circuit. At the bottom, substrate 200 is the wafer that contains the transistors and other devices. Layer 210 is the first layer of dielectric. Layer 215 contains a set of lower alignment marks 230 that have been formed by etching and then depositing a suitable visible material or any other convenient process. The lower marks can be placed on any layer. They do not have to be on the lowest layer. There may be as many sets of lower marks as the designers wish to include.

Layer 220 is another layer of dielectric that is sufficiently transparent to permit optical techniques to compare the location of lower and upper alignment marks.

Layer 240 is the hardmask made according to the invention. Layer 250 is a layer of photoresist that has been defined with patterns 255 that will be used to form the upper alignment marks, e.g. by depositing a material that has contrast with the other materials in the field of view.

Figure 3:
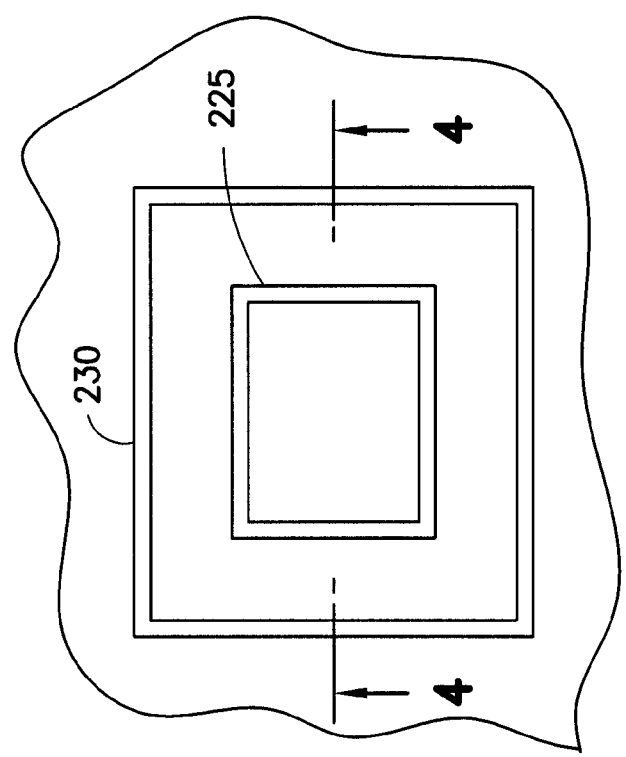
FIG. 3 is a top view of an alignment structure.

FIG. 3 shows a top view of a typical alignment mark layout. Box 230 is formed by the lower structures 230. Box 225 is formed by the upper marks that were deposited in apertures 255 of layer 250.

Figure 4:
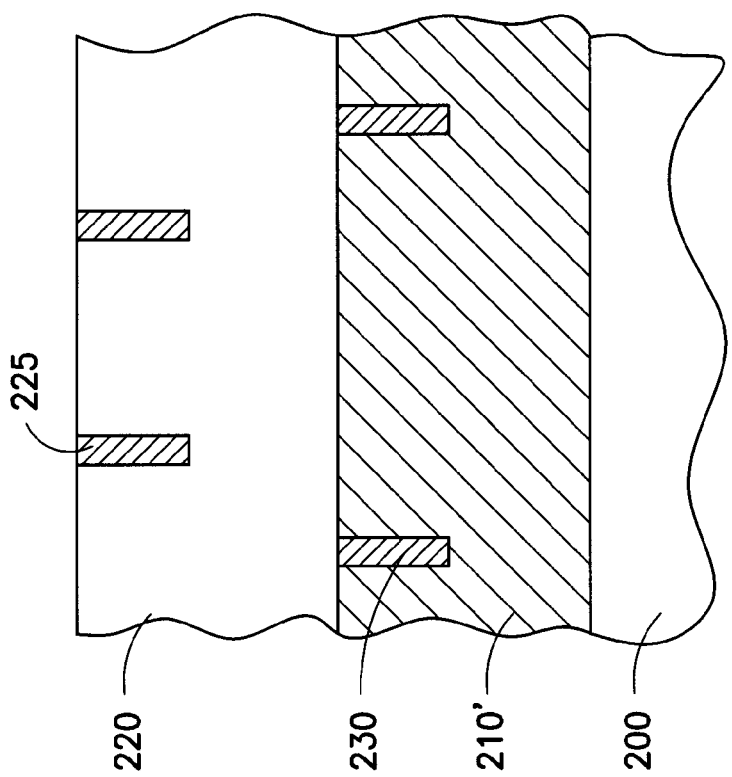
FIG. 4 is a cross section of the alignment structure of FIG. 3.

FIG. 4 shows another cross section of the structure of FIG. 3, taken along line 4—4 in FIG. 3. The lower portion of the Figure is the same as FIG. 2, with the change that the two layers 210 and 215 of FIG. 2 are shown as a single layer 210'. Both alternatives are satisfactory.

Layer 220 now has two upper alignment marks 225 embedded in it, after conventional processing.

A quantitative measure of alignment accuracy has been formulated that, in the case of the 90 nm node, has a threshold of 1.5 for satisfactory alignment on a scale that goes from 0 to 10. The expected alignment performance of low-resistivity and the high resistivity films was modeled for a damascene interconnect structure at the M2, M3, M4, M5 and M6 levels. It was found that the alignment signal of the high-resistivity TaN was much greater compared to background noise than comparable signals for lower resistivity films.

Modeled values for the high resistivity films at the M2, M3, M4, M5 and M6 levels were 3.3, 6.0, 9.7, 6.8 and 1.7, respectively. Modeled values for the low resistivity films at the M2, M3, M4, M5 and M6 levels were 1.1, 2.4, 3.6, 2.6, and 0.55, respectively. All of the high resistivity values are acceptable for the 90 nm node. The values for the low resistivity case are acceptable from the M2 through the M5 level. However, as evident, in the cases of M1 and M6 levels, alignment becomes unacceptable.

Those skilled in the art will readily be able to adjust the process to suit their particular circumstances. The magnetron power (or other power to the plasma) and the N to carrier gas ratio may be varied, along with the material thickness.

It is not necessary for the practice of the invention that a damascene process be used for the alignment marks and other processes may also be used. For example, the upper alignment marks do not have to be formed through the hardmask. They could be formed by any convenient method before the hardmask is put down.

The thickness of the ILD layer (and the number of ILD layers) between the lower and upper alignment marks are not critical for the invention and various alternatives are possible.

While the invention has been described in terms of a single preferred embodiment, those skilled in the art will recognize that the invention can be practiced in various versions within the spirit and scope of the following claims.

What is claimed is:

1. A method of forming a layer of interconnect in an integrated circuit comprising the steps of:
    depositing a first layer of interlayer dielectric (ILD) on a lower layer of said integrated circuit above a set of lower alignment marks;
    depositing a first hardmask layer of TaN on said first layer of ILD, said first layer being substantially transparent in a relevant wavelength range in which said hardmask layer has a resistivity greater than about 400 micro Ohm-cm;
    forming an upper set of alignment marks;
    patterning said ILD through said hardmask layer to form a set of apertures in said ILD; and
    forming a conductive interconnect in said set of apertures.

2. A method of forming a layer of interconnect in an integrated circuit comprising the steps of:
  depositing a first layer of interlayer dielectric (ILD) on a lower layer of said integrated circuit above a set of lower alignment marks;
  depositing a first hardmask layer of TaN on said first layer of ILD, said first layer being substantially transparent in a relevant wavelength range;
  forming an upper set of alignment marks;
  patterning said ILD through said hardmask layer to form a set of apertures in said ILD; and
  forming a conductive interconnect in said set of apertures;
  in which said hardmask layer is deposited by sputter deposition of Ta in an ambient containing $N_2$ and a carrier gas such that ($N_2$flow)/($N_2$+carrier flow)>0.5.

3. A method according to claim 1, in which said hardmask layer is deposited by chemical vapor deposition by reacting a precursor gas containing Ta in an ambient containing $N_2$.

4. A method according to claim 2, in which said hardmask layer is substantially transparent in said relevant wavelength range.

5. A method according to claim 3, in which said hardmask layer is substantially transparent in said relevant wavelength range.

6. A method according to claim 2, in which said hardmask layer has a resistivity greater than about 400 micro Ohm-cm.

7. A method according to claim 2, in which said hardmask layer has a thickness ranging from 5 nm to 100 nm.

8. A method according to claim 3, in which said hardmask layer has a thickness ranging from 5 nm to 100 nm.

9. A method according to claim 2, in which said hardmask layer has a composition of less than 50% Ta.

10. A method according to claim 3, in which said hardmask layer has a composition of less than 50% Ta.

* * * * *